US006424737B1

(12) United States Patent
Rising, III

(10) Patent No.: US 6,424,737 B1
(45) Date of Patent: Jul. 23, 2002

(54) METHOD AND APPARATUS OF COMPRESSING IMAGES USING LOCALIZED RADON TRANSFORMS

(75) Inventor: Hawley K. Rising, III, San Jose, CA (US)

(73) Assignees: Sony Corporation, Tokyo (JP); Sony Electronics Inc., Park Ridge, NJ (US)

(*) Notice: Subject to any disclaimer, the term of this patent is extended or adjusted under 35 U.S.C. 154(b) by 0 days.

(21) Appl. No.: 09/767,271

(22) Filed: Jan. 22, 2001

Related U.S. Application Data

(60) Provisional application No. 60/177,787, filed on Jan. 24, 2000.

(51) Int. Cl.[7] .............................. G06K 9/36; G06K 9/46; G06K 9/62

(52) U.S. Cl. ....................... 382/156; 382/232; 382/240; 382/281

(58) Field of Search ................................. 382/156–158, 382/232–233, 240, 248, 280, 281; 708/400–405; 375/240.01, 240.19

(56) References Cited

U.S. PATENT DOCUMENTS

| | | | | |
|---|---|---|---|---|
| 5,414,804 A | * | 5/1995 | McWaid | 395/133 |
| 5,686,961 A | * | 11/1997 | Gasztonyi et al. | 348/390 |
| 5,953,452 A | * | 9/1999 | Boone et al. | 382/199 |
| 6,223,195 B1 | * | 4/2001 | Tonomura | 708/402 |
| 6,259,396 B1 | * | 7/2001 | Pham et al. | 342/90 |

OTHER PUBLICATIONS

International Search Report, PCT/US01/02430, pp. 4.
Rising, "Inversion Processes in the Human Visual System," vol. 3959 (2000), Sony MediaSoft Lab, U.S. Research Labs, San Jose, California, pp. 400–410.
Albanesi, "Thresholding Wavelets for Image Compression", 1998, IEEE, University of Pavia, Dipartimento di Informatica e Sistemistica, pp. 374–389.
Ahmed, et al., "Application of Multi–layer Neural Networks to Image Compression", 1997 IEEE, International Symposium on Circuits and Systems, Jun. 9–12, 1997, Hong Kong, pp. 1273–1276.
Meir, et al., "Stochastic Approximation by Neural Networks Using the Radon and Wavelet Transforms", 1998 IEEE, Department of Electrical Engineering, Israel, pp. 224–233.
Carroll, et al., "Construction of Neural Nets Using the Radon Transform", Department of Electrical Engineering, Princeton University, IJCNN International Joint Conference On Neural Networks, Jun. 19–22, 1989, p. 6.
Khuwaja, et al., "Fingerprint Image Compression", Physics Department, Kuwait University, IEEE, pp. 517–526.
Fanghanel, et al., "Optimizing Wavelet Transform Coding Using a Neural Network", 1997 IEEE, Universitat der Bundeswehr Hamburg, pp. 1341–1343.
Anderson, J. R. "Arguments Concerning Representations for Mental Imagery", Psych. Rev. vol. 85, No. 4, Jul. 1978, pp. 249–277.
Arnold, V. I. "Geometrical Methods in the Theory of Ordinary Differential Equations", Table of Contents, New York, Springer–Verlag, 1983, p. 5.

(List continued on next page.)

Primary Examiner—Bhavesh Mehta
(74) Attorney, Agent, or Firm—Blakely, Sokoloff, Taylor & Zafman LLP

(57) ABSTRACT

A method and an apparatus of compressing data. The method and apparatus include constructing a neural network having a specific geometry using a finite and discrete Radon transform. The data is then fed through the neural network to produce a transformed data stream. The transformed data stream is thresholded. A fixed input signal is fed back through the neural network to generate a decoding calculation of an average value. The thresholded data stream is entropy encoded.

18 Claims, 14 Drawing Sheets

OTHER PUBLICATIONS

Barth, E., et al., "Image Encoding, Labeling, and Reconstruction from Differential Geometry", CVGIP, Jun. 1992, pp. 428–445.

Beutelspacher, A., et al., "Projective Geometry From Foundations to Applications", New York, Table of Contents, Cambridge University Press, 1998, p. 3.

Blum, L., et al., "Complexity and Real Computation", Table of Contents, New York, Springer–Verlag, 1997, p. 12.

Bolker, E. D. "The Finite Radon Transform", Integral Geometry, R. L. Bryant, et al., AMS Contemporary Mathemetics, vol. 63, 1984, pp. 27–50.

Buekenhout, F., "Handbook of Incidence Geometry", Table of Contents, New York, North Holland, Elsevier, 1995, p. 24.

Carroll, S. M., et al., "Construction of Neural Nets Using the Radon Transform", IJCNN, vol. 1, 1989, pp. 607–611.

Diaconis, P., "Projection Pursuit for Discrete Data", Technical Report No. 198, Department of Statistics, Stanford University, Apr. 1983, pp. 1–28.

Edelman, S., "Representation, Similarity and the Chorus of Prototypes", Minds and Machines, Feb. 1995, pp. 45–68.

Helgason, S., "Groups and Geometric Analysis", Table of Contents, New York, Academic Press, 1984, p. 8.

Ito, Y., "Representations of Functions by Superpositions of a Step or Sigmoid Function and Their Applications to Neural Network Theory", Neural Networks, vol. 4, No. 3, 1991, pp. 385–394.

Kawakami, S., et al., "A Cell Model for the Detection of Local Image Motion on the Magnocellular Pathway of the Visual Cortex", Vision Research, vol. 36, No. 1, 117–147, 1996.

Kung, J. P. S., "Reconstructing Finite Radon Transforms", Nuclear Physics B (Proc. Supl.), vol. 5A, Sep. 1988, pp. 44–49.

Kosslyn, S. M., "Image and Brain" Cambridge, Massachusetts, MIT Press, 1994, p. 34.

Kurusa, A., "The Radon transform on half sphere" Acta Sci. Math. (Szeged), vol. 53, Nos. 1–4, 1993, pp. 143–158.*

Matus, F., et al., "Image Representations via a Finite Radon Transform" IEEE Trans. PAMI, vol. 15, No. 10, Oct. 1993, pp. 996–1006.*

Meyer, Y., "Wavelets Algorithms and Applications", Philadelphia, SIAM Press, 1993, Table of Contents, p. 10.*

Okamoto, H., "MT neurons in the macaque exhibited two types of bimodal direction tuning as predicted by a model for visual motion detection" Vision Research 39, 1999, pp. 3465–3479.*

Poggio, T., et al., "On the Representation of Multi–Input Systems: Computational Properties of Polynomial Algorithms" Biological Cybernetics, vol. 37, No. 3, Jul. 1980, pp. 167–186.*

Ramm, A. G., et al., "The Radon Transform and Local Tomography", Table of Contents, New York, CRC Press, 1996, p. 10.

Rising, H. K., "Creating a Biologically Plausible Model of Recognition which Generalizes Multidimensional Scaling" SPIE, vol. 3644, Human Vision and Electronic Imaging IV, Rogowitz, B. E., et al., Jan. 1999, pp. 411–420.

Rising, H. K., "Deriving and combining biologically plausible Processes with the Windowed Radon Transform" SPIE Prnc. vol. 3299, Human Vision and Imaging III, Rogowitz, B. E., et al. Jan. 1998. pp. 519–525.

Rising, H. K., "Assessing the Similarity of Mechanisms in Motion and Color Processing for Synchronization of Visual Pathways", SPIE, vol. 3016, Human Vision and Imaging II, Rogowitz, B. E., et al., Feb. 1997, pp. 302–312.

Rolls, E. T., et al. "Neural Networks and Brain Function", New York: Oxford University Press, Preface and Table of Contents, 1998, p. 5.

Shepard, D., "Optimizing the Delivery of Radiation Therapy to Cancer Patients", SIAM Review, vol. 41, No. 4, 1999, pp. 721–744.

Siegelmann, H. T., et al., "On the Computational Power of Neural Nets", Proceedings of the 5th ACM Workshop on Computational Learning Theory, Jul. 1992, pp. 440–49.

Vvedenskaya, N. D., et al., "Discrete Radon Transform and Image Reconstruction" Mathematical Problems in Tomography., Gelfand, I. M., et al., AMS, vol. 81, 1990, pp. 141–188.

Wallis, W. D., "Combinatorial Designs", Table of Contents, New York, Marcel Dekker, 1988, p. 10.

Zeki, S., "A Vision of the Brain", Table of Contents, Boston, Blackwell Scientific Publications, 1994, p. 5.

* cited by examiner

METHOD AND APPARATUS OF COMPRESSING IMAGES USING LOCALIZED RADON TRANSFORMS

This application claims the benefit of U.S. Provisional Application No. 60/177,787, "METHOD OF COMPRESSING IMAGES USING LOCALIZED RADON TRANSFORMS", filed Jan. 24, 2000.

FIELD OF THE INVENTION

The present invention relates generally to image compression. More particularly, the present invention relates image compression using neural networks.

BACKGROUND OF THE INVENTION

Wavelet transforms are widely used in analysis, where they are known as "multiresolution analysis", and in image and audio compression, where they are used as a pyramid coding method for lossy compression. The wavelets used are generally from a very small set of analytically designed wavelets, such as Daubechies wavelets, or quadrature mirror filters ("QMF"). For some applications, designing specific wavelets with special coding properties would be beneficial.

Presently, compression methods directed to image and video compression attempt to minimize the amount of bandwidth used for a single band. There are no compression methods directed to reducing the amount of total activity in a network.

SUMMARY OF THE INVENTION

A method and apparatus of compressing data is described. The method and apparatus include constructing a neural network having a specific geometry using a finite and discrete Radon transform. The data is then fed through the neural network to produce a transformed data stream. The transformed data stream is thresholded. A fixed input signal is fed back through the neural network to generate a decoding calculation of an average value. The thresholded data stream is entropy encoded.

BRIEF DESCRIPTION OF THE DRAWINGS

Features and advantages of the present invention will be apparent to one skilled in the art in light of the following detailed description in which.

DETAILED DESCRIPTION

Figure 1:
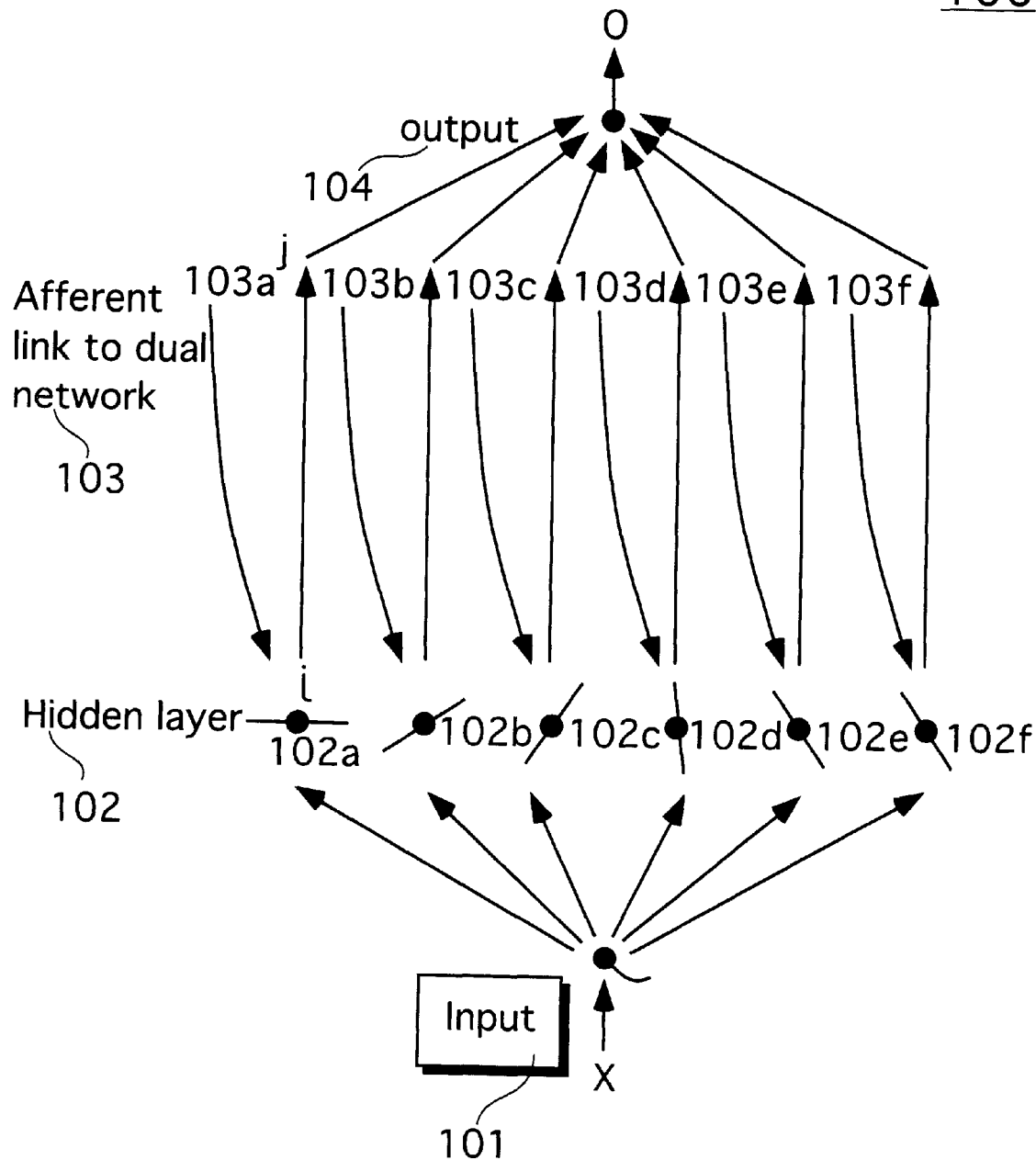
FIG. 1 is a diagram of one embodiment of a multilayer perceptron.

A method and an apparatus of creating wavelet basis are described. In the following detailed description of the present invention, numerous specific details are set forth in order to provide a thorough understanding of the present invention. However, it will be apparent to one skilled in the art that the present invention may be practiced without these specific details. In some instances, well-known structures and devices are shown in block diagram form, rather than in detail, in order to avoid obscuring the present invention.

Some portions of the detailed descriptions that follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

Wavelet transforms convert a signal into a series of wavelets. Wavelets are convenient for data transformation because they are finite in nature and contain frequency information. Since most actual waves have a finite duration and their frequencies change abruptly, wavelet transforms are better approximations for actual waveforms than other transforms, such as the Fourier transform. Signals processed by wavelet transforms are stored more efficiently than those processed by Fourier transforms.

Imagery may be created by inverting one or more layers of function in neural networks. Such a reversal of visual system processing may take place in stages or all at once. Finite Radon transforms on certain geometries are used to accomplish the reversal of the visual system processing. A dual system is created to certain feed forward network models of visual processing, and its application to visual processing and to non-image processing applications is shown.

For purposes of explanation, in the following description, numerous specific details are set forth in order to provide a thorough understanding of the present invention. It will be apparent, however, to one skilled in the art that the present invention can be practiced without these details. In other instances, well-known structures and devices are showing block diagram form in order to avoid obscuring the present invention.

In image signal processing, an underlying assumption for any model of the visual system must deal with recall of imagery as well as comparison, classification and identification. Images are recalled in some form such as mental imagery, dream sequences, and other forms of recall, more or less vivid, depending on the individual. A basic postulate of visual imagery is that imagery comes from the creation, or recreation, of visual signals in the areas of the brain which process incoming images.

One approach to modeling visual systems is to assume that the processes of the visual system would have to be inverted in order to produce imagery within the visual system as a form of recall. Both the inversion process and the estimation of the visual system may be examined by looking at the inversion of the Radon transform. This is because the forward transformations, which in many cases occur in the visual system, resemble Radon transforms. Thus, the process of extracting information from the visual stream is modeled using the Radon transform and its dual backprojection.

In Radon transforms, instead of assigning a value to each point on a plane, each line on a plane is assigned a value by adding up the values of all the points along the line (i.e. take the integral of the points along the line). To obtain the backprojection of the Radon transform, the value of a particular point on a plane is calculated using the values of all the lines that go through the particular point.

A neural network ("neural net") is a collection of nodes and weighted connections between the nodes. The nodes are configured in layers. At each node, all of the inputs into the node are summed, a non-linear function is applied to the sum of the inputs and the result is transmitted to the next layer of the neural network. A neural network may be used to build a radon transform.

Multilayer perceptrons ("MLP") are a frequent tool in artificial neural networks. MLP have been used to model some brain functions. It has been shown that MLP with one hidden layer may be used to model any continuous function. Thus, given a layer that models a function of sufficient dimension, the ability to form Radon transform inverses implies the ability to form all continuous functions.

An MLP with one hidden layer is capable of representing a continuous function. It can be shown that the function it represents is the function that results from backprojecting whatever function is represented at the hidden layer. In order to build a neural network (MLP) for a particular function, a training method is used (usually backprojection) to set the weights at the hidden layer. If the function is discrete, then it should be set to the Radon transform of the desired function, with a sharpening filter imposed to get rid of the blurring from the average. If there is no average, then there is no blurring and no sharpening is needed.

In the context of human vision, input is put through a different kind of neural network, particularly one that performs a finite or discrete Radon transform. If this network is set to create the Radon transform of the desired function, then it can be used to set the weights needed by the MLP. So this neural network (afferent on the hidden layer of the MLP) trains the MLP. This is quicker than backpropogation, and unlike traditional techniques such as backpropogation, it allows the calculation of additional weights to add neurons to the MLP hidden layer.

FIG. 1 is a diagram of a multilayer perceptron. Multilayer perceptron 100 includes an input 101, a hidden layer 102, an afferent link to dual network 103 and output 104. An input 101 is received by MLP 100 and processed through hidden layer 102. Hidden layer 102 includes nodes 102a–f The nodes 102a–f are shown for illustration purposes. A hidden layer 102 may include greater or fewer nodes depending on the design of the MLP.

Neural networks of arbitrary complexity may be constructed using discrete and finite Radon transforms. A discrete and finite Radon transform involves taking the values of line segments instead of lines. Thus, the values of all the line segments on a plane are taken for the discrete Radon transform and the backprojection of the Radon transform is accomplished using line segments through a particular point.

Generally a backprojection is not the inverse of a Radon transform because there is some blurring. Thus, typically a filter is used to make the inverse sharper. However, if the function is transferred to a new function on points so that the backprojection of a radon transform is the radon transform's inverse, there is no blurring. The transformation of the function that causes the backprojection to be the inverse is a wavelet transformation because it satisfies "the wavelet condition" (that the average value of the function is zero).

The central equation for constructing the neural networks, the Gindikin or Bolker equation, involves backprojecting the Radon transform and subtracting a global (to the point in question) average function. The nature of the average function to be subtracted is dependent on the transform geometry, and can be varied by varying the interconnect structure of the neural network.

The transform is dual to the network. Thus, the transform may be weighted to a desired template function.

Hidden layer 102 is represented as a Radon backprojection. Thus, input 101 is the stored sum of the values of line segments going through the point. At hidden layer 102, a function representing a radon transform is performed on the input 101.

Thus, if the input 101 is represented by x, the output 104 is represented by $o=(\sigma \Sigma_i \ _{xi} \ w_{ij})$, where $\sigma$ is the radon transform.

As illustrated, hidden layer 102 receives input 101 and afferent inputs 103a–f Afferent inputs 103a–f being transmitted to hidden layer 102 represent the back propagation of the MLP 100. Thus, if MLP 100 represents a radon transform, afferent inputs 103a–f are the inversions of the radon transform. The back propagation is used to adjust the weights of the function at hidden layer 102 so that the inversion 103a–f is equal to the input 101.

The sum of the inputs received at each of nodes 102a–f is processed by applying a function, such as a radon transform backprojection.

The afferent inputs are received through afferent link 103 to a dual network (not shown). The afferent inputs are inversions of the radon transforms. The results of hidden layer 102 processing are summed using a weighting to produce output 104.

After the network is prepared, the wavelet prototype, is fed through a network and its back propagation. The wavelet prototype is generally a function which is close to the desired shape, if that is known, although it is arbitrary.

The output is then used to modify the input function by subtracting output from the input function to obtain a difference and moving the input function in the opposite direction from the difference. The process converges to zero difference between the input and the output, which satisfies the wavelet condition. The resulting function is then a "mother wavelet" from which a wavelet basis local to that point may be formed.

In constructing discrete radon transform inverses, the inverse process on different geometries and for different structures are examined. One inverse, based on cosets of $Z_p^2$ has the form $$f(x) = a(f) + \sum_{g \in G_x} (f(g) - a(f)) \quad \text{(Equation 1)}$$

where $Z_p$ is the ring with p elements, with addition being addition modulo p, and multiplication likewise. This is standard notation. The superscript 2 indicates that this is the ring of ordered pairs of two members of this ring, with addition and multiplication done componentwise. It is the ring of pairs (a, b) where a and b are in the ring $Z_p$. This is known to one skilled in the art. In equation 1, the sum ($\Sigma$) is taken over the incidence set $G_x$ of lines in the group which intersect x and the average, represented by a(f), is taken over the whole group. See F. Matus and J. Flusser, "Image Representations via a Finite Radon Transform," *IEEE Trans. PAMI*, v. 15, no. 10, 1993, pp. 996–1006. The form implies that, for a function with zero average, the backprojection is the inverse. If the cosets of $Z_p^2$ are plotted, the plot is essentially a discretization of the closed geodesics on a torus.

Figure 2A:
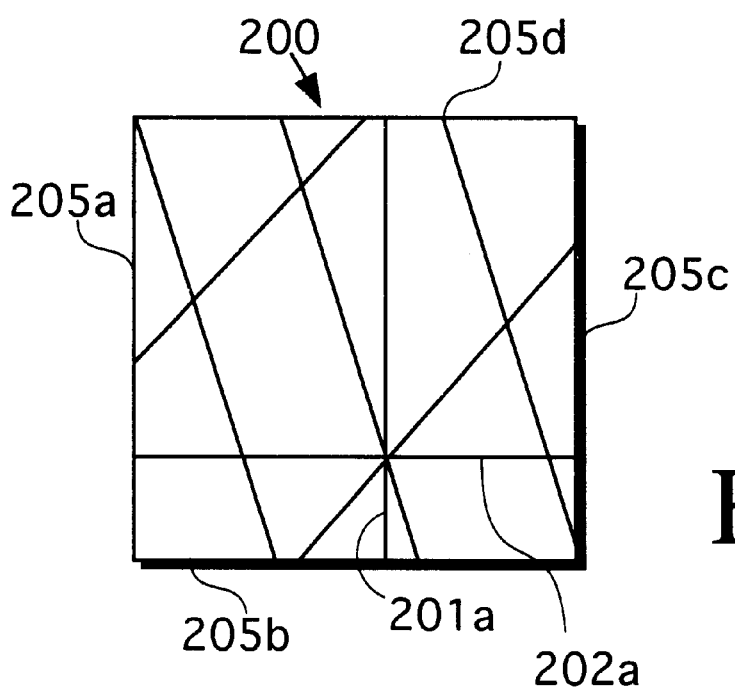
FIGS. 2a and 2b are illustrations of a unit square and a torus.
Figure 2B:
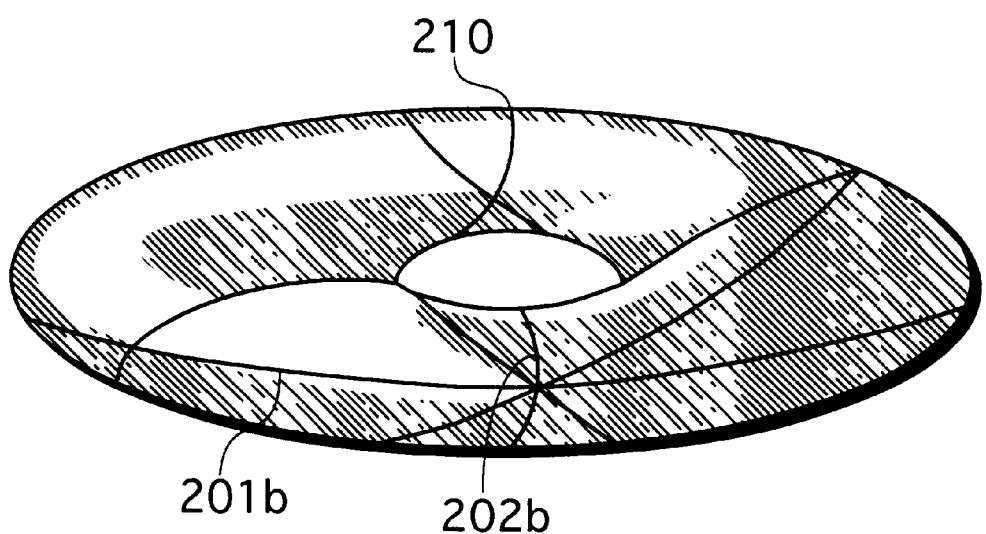

FIGS. 2a and 2b are illustration of a unit square and a torus. Unit square 200 includes sides 205a–d. As seen in FIG. 2b, torus 210 is formed by joining opposite sides of a unit square 200 such as, for example, sides 205a and 205c. This operation is an isometry, so that the size and shape of a volume element does not change from that for $R^2$. Consequently, the geodesics on the torus map to straight lines in $R^2$, and they pack tightly, forming uniform approximations to the averages on that surface. For example, geodesics 201b and 202b on torus 210 map to straight lines 201a and 202a in unit square 200.

While, the same is not true for a half-sphere, an interesting version of the inversion formal may be formed for the half-sphere which will lead to finding a reasonable formula for the human visual system.

Figure 3A:
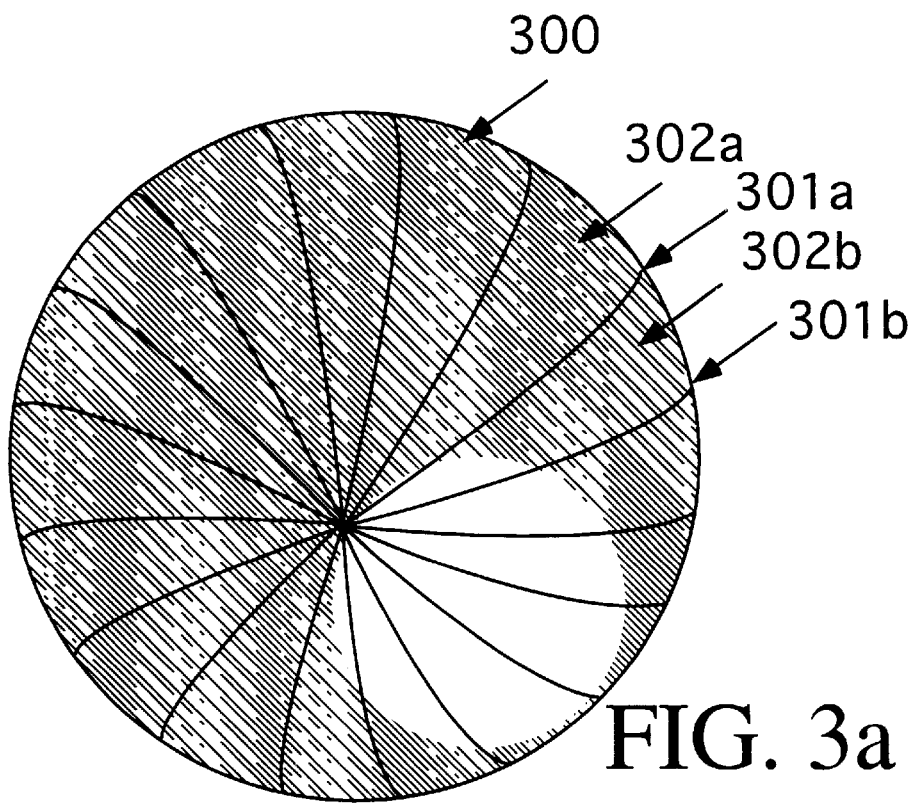
FIG. 3a illustrates one embodiment of geodesics on a sphere.

FIG. 3a illustrates one embodiment of geodesics on a sphere. Sphere 300 includes geodesics 301a and 301b, for example. On the sphere, geodesics are "great circles", meaning that for $S^n$, any copy of $S^{n-1}$ shares the same center and radius as the sphere itself. An antipodal map, which takes x to its opposing point on the other side of the sphere, may be denoted by A(x). However, an invertable transform on a sphere, using integration along geodesics, can not be obtained because the geodesics through point x are identical to those through A(x).

If the transform is restricted to functions for which f(x)=f(A(x)), then the transform is essentially restricted to a half-sphere transform. By equating the points x and A(x), another essentially property is found. Given two points on the half-sphere, there is exactly one geodesic which passes through them.

An inversion over geodesics on the sphere may be obtained as follows. Assuming that for each point $x_0$ a half-sphere maybe used, k+1 geodesics 301a,b through $x_0$ are chosen, divided into k sections including sections 302a, b, for example. On each section 302a,b of geodesic $g_i$, a representative $x_{ij}$ is chosen. A discrete Radon transform is calculated by taking the average of the k sections using the formula $$\hat{f}(g_i) = \frac{1}{k} \sum_{j=1}^{k} f(x_{ij}). \quad \text{(Equation 2)}$$

To keep notation simple, by rearranging the indices for example, the sample on each geodesic containing $x_0$ is indexed $x_{i1}$, and the sample picked for this segment on all geodesics is $x_0$. Constraints on segmenting the geodesics insure that this is reasonable as k gets large.

The backprojection at point $x_0$ is defined to be the sum of the values on the geodesics through $x_0$, $$S\hat{f}(x_0) = \sum_{x_0 \in g_i}^{k} \hat{f}(g_i). \quad \text{(Equation 3)}$$

The sum may be rearranged to be $$S\hat{f}(x_0) = \sum_{i=0}^{k} \frac{1}{k} \sum_{j=1}^{k} f(x_{ij}) = \quad \text{(Equation 4)}$$

$$\frac{1}{k}\left(\sum_{i=0}^{k}\sum_{j=1}^{k} f(x_{ij}) + f(x_{01})\right) + \frac{1}{k}\sum_{i=1}^{k} f(x_{i1}).$$

In equation 4, the first term in the expression contains one copy of each of the $k^2$ samples taken. Denoting the average value over all the samples as $\bar{f}$, since $x_0$ is chosen to be the sample for each segment in which it falls, the equation is $$f(x_0) = \bar{f} + \sum_{i=0}^{k} (\hat{f}(g_i) - \bar{f}).\quad\text{(Equation 5)}$$

With some adjustments in the samples taken, as the size of the sample set grows, $\bar{f}$ approaches the average value of the function over the half-sphere, and $\hat{f}(g_i)$ approaches the usual definition of the Radon transform. Matus and Flusser found the same expression in the case of the group $Z_p^2$, where their analysis performs the double fibration alluded to by Bolker. See E. D. Bolker, "The Finite Radon Transform," *Integral Geometry*, AMS Contemporary Mathematics ser., v. 63, 1984, pp. 27–50; F. Matus and J. Flusser, "Image Representations via a Finite Radon Transform," *IEEE Trans. PAMI*, v. 15, no. 10, 1993, pp. 996–1006.

Equation 5 is a limit value for the formula given by Bolker in the case of sets in which there are certain block design constraints. The constraints are satisfied above by noting that, given two points on the half-sphere, there is exactly one geodesic passing through them, and by the use of the index k, guaranteeing that there are equal numbers of geodesics through each point in the discretization formula. Specifically, using Bolker's notation, $\alpha=k+1$ and $\beta=1$, so that the formula reads $$f(x) = \frac{1}{\alpha - \beta} SRf(x) + \frac{\beta}{\alpha - \beta}\mu(f) = \frac{1}{k} SRf(x) + \frac{1}{k}\mu(f).\quad\text{(Equation 6)}$$

In Vvedenskaya and Gindikin's formula, the term $\beta$ does not show specifically because it is arranged by geometry. See N. D. Vvedenskaya and S. G. Gindikin, "Discrete Radon Transform and Image Reconstruction," *Mathematical Problems in Tomography*, AMS, 1990, 141–188. The term $\beta$ does allow, however, the building of interesting biologically plausible structures.

In order to create a scenario resembling the finite transforms encountered in brain processing, a set of discrete transforms need to be woven together into a sheet. This is done by using the formula for the half-sphere (Equation ??) and acknowledging the finiteness of each geodesic set.

First segments of geodesics are taken on the half-sphere. If a pattern of finite segments is allowed, then one possible arrangement is to allow that each segment is incident on points only along the geodesic on which it lies, that each segment is incident on the same number of points, and that there is a segment centered at each sample point.

If the number of samples in each segment is k, and there is a sample centered at each $X_{ij}$, then there are k segments incident on the trial sample point $x_0$. These k segments comprise $k^2$ samples, counting repetition, so that an "average" over these segments would require a factor of $1/k^2$. The rest of the analysis proceeds as with the half-sphere analysis, except that there is a different average value calculation, and, a different wavelet condition. The average is replaced with a weighted average.

Each local set along a geodesic on the half-sphere will be referred to as a segment, and it will be assumed that each segment contains k samples. Furthermore, it is assumed that the segments are centered at samples spaced one sample apart, so that along a given geodesic, the segment centered at $x_{ij}$ contains $x_0$ if, and only if, the distance between the two samples is less than $(k-1)/2$.

For each distance $0 < d \leq (k-1)/2$, there are two segments whose centers are this far from $x_0$, so that there are a total of $k-1$ segments which overlap $x_0$, but are not centered there. Thus, there are k segments which contain $x_0$ along any geodesic.

Because each segment contains k samples, there are a total of $k^2$ values summed by summing up the segments along one geodesic overlapping $x_0$. Each set of segments along one geodesic covering the point $x_0$ will be referred to as a "leaf".

Figure 3B:
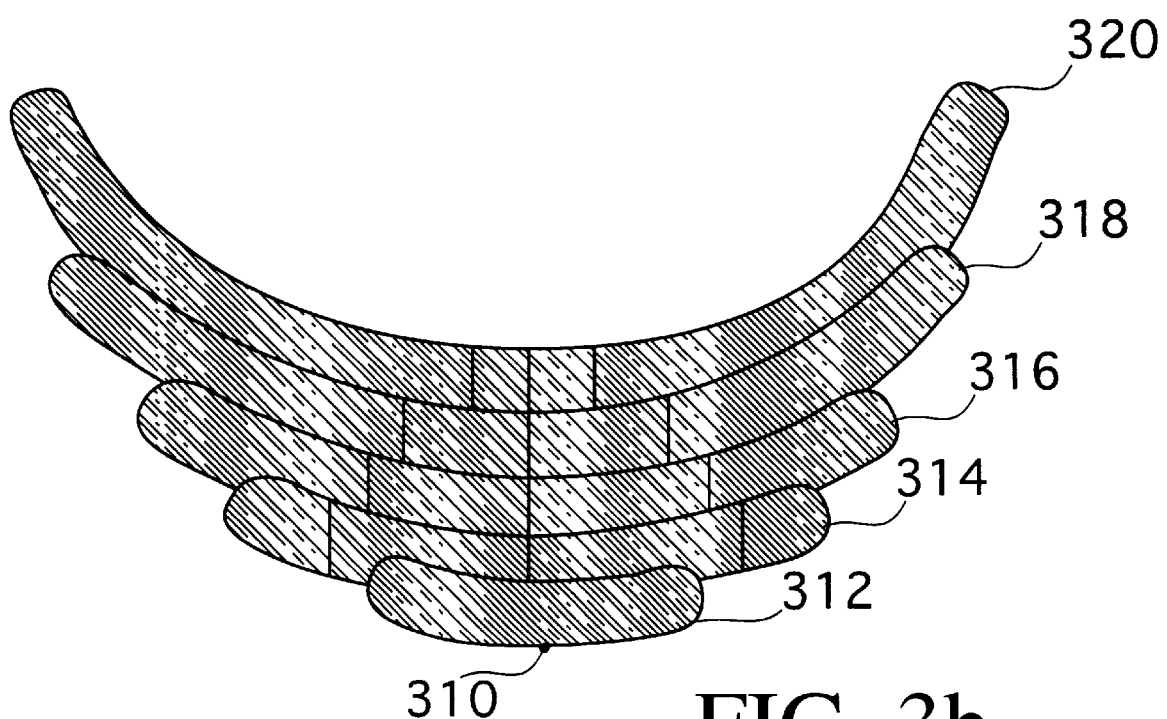
FIG. 3b is an illustration of a leaf showing one embodiment of the overlapping segments of the geodesic of a half-sphere.

FIG. 3*b* is an illustration of a leaf showing one embodiment of the overlapping segments of the geodesic of a half-sphere. Point 310 represents a point $x_0$ on a half-sphere. Segments 312, 314, 316, 318 and 320 overlap along a geodesic covering point $x_0$. Segments 312–320 form a leaf.

Proceeding with the previous construction, without making adjustments for the number of overlaps or samples, the Radon transform for a segment of length k centered at sample $x_{ij}$ will be defined as $$\hat{f}(g_{ij}) = \sum_{l=1}^{k} f(x_{il})\quad\text{(Equation 7)}$$

and the backprojection or adjoint transform will be defined $$S\hat{f}(x_0) = \sum_{x_0 \in g_{ij}} \hat{f}(g_{il})\quad\text{(Equation 8)}$$

to be the sum over the set of all segments of all leaves at $x_0$. Written for in terms of samples, for each leaf, the sum is $$S_l\hat{f}(g_{ij}) = \sum_{l=1}^{k} (k-d)f(x_{il}).\quad\text{(Equation 9)}$$

As before, assuming $k+1$ geodesics on the half-sphere, intersecting $x_0$, the equation becomes $$S\hat{f}(x_0) = \sum_{i=0}^{k} \sum_{j=1}^{k} (k-d)f(x_{ij}).\quad\text{(Equation 10)}$$

The sum, as before, is manipulated to expose the inverse formula:

$$S\hat{f}(x_0) = \sum_{i=0}^{k}\sum_{j=2}^{k}(k-d)f(x_{ij}) + \sum_{i=0}^{k} f(x_{ij}) =$$
$$\left(\sum_{i=0}^{k}\sum_{j=2}^{k}(k-d)f(x_{ij}) + kf(x_{01})\right) + \sum_{i=1}^{k}k(f_{il}).\quad\text{(Equation 11)}$$

The term inside the parentheses in Equation 11 has $(k+1)(k^2-k)+k=k^3$ samples, indicating that if the Radon transform were defined with a factor accounting for the $k^2$ samples occurring on each leaf, and the 'average' were defined to be the sum on the right, with a weighting factor of $1/k^3$, to account for the samples on each leaf, the inverse formula would be $$f(x_0) = \mu(f) + \sum_{x_0 \in g_{ij}} (\hat{f}(g_{il}) - \mu(f)).\quad\text{(Equation 12)}$$

The weighted average $\mu(f)$ needs to be expressed as a function of the Radon transform of f, not f itself See Bolker.

If the incidence structure of the points and segments is uniform, this is no problem because then every point ends up with k segments incident on it, and the weighting formula may be defined on the Radon transform segments by defining a distance d between the segment and $x_0$ to be the distance from $x_0$ to the center of the segment.

For the spherical model, this leads to an average over all segments, weighted by distance and divided by a factor of k, for the overlap. The same exercise may be done using different packing formulas, which amount to specifying the connectivity between points in the model of the visual system.

Figure 4:
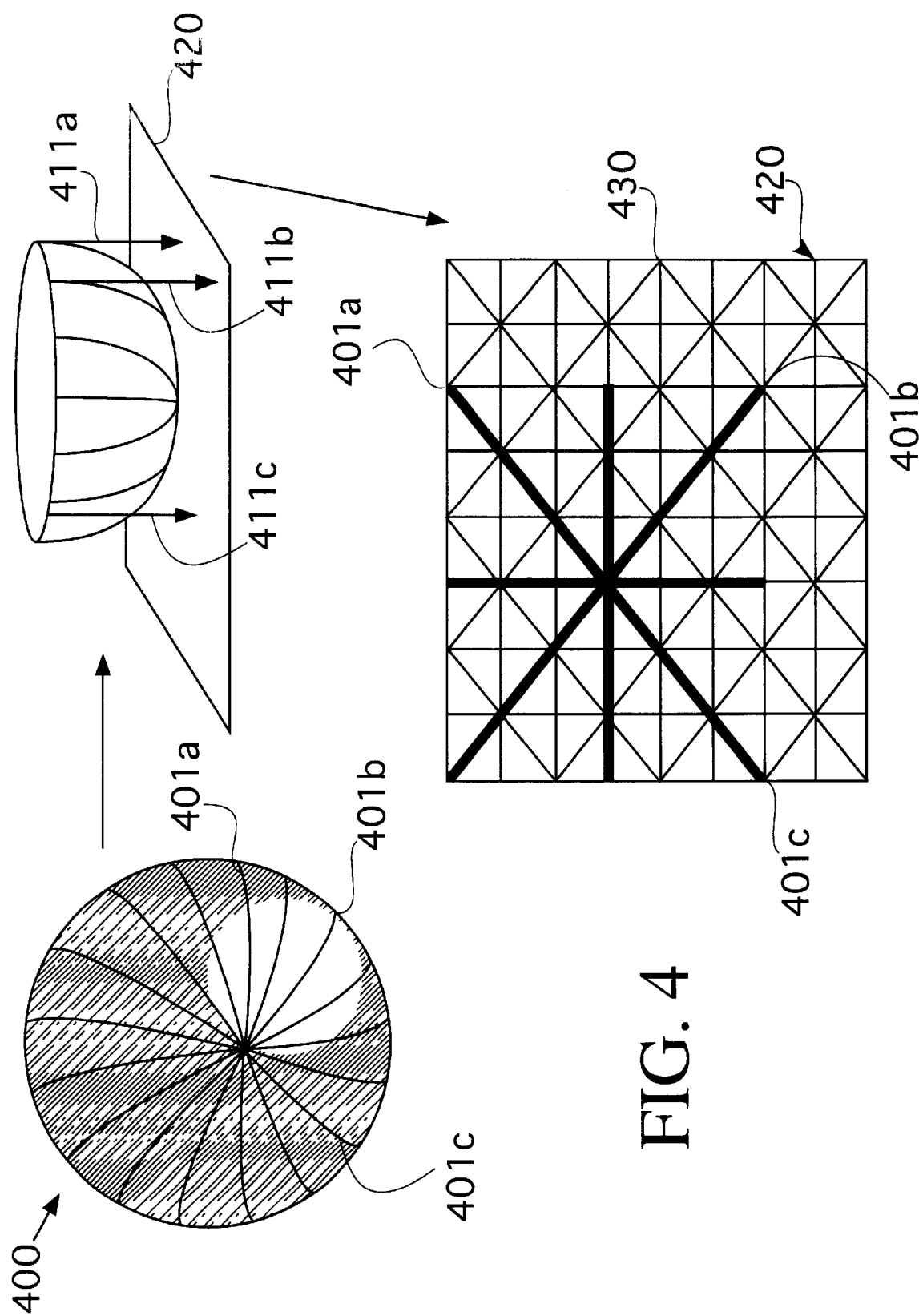
FIG. 4 is an illustration of one embodiment of the mapping of half-sphere geodesics to a plane in a continuum.

FIG. 4 is an illustration of one embodiment of the mapping of half-sphere geodesics to a plane in a continuum. Half-sphere 400 has geodesics 401 a,b,c. The geodesics 401a,b,c are mapped 411a,b,c to plane 420 including a grid 430. The shape shown for the grid 430 is a function of the kind of connectivity the continuum has.

By using orthographic projection, a domain of points is obtained at which oriented filters are represented by Radon set transforms. Consequently, the form for an inversion of a uniformly packed domain of finite segment Radon transforms have been found. As with the other cases examined, if a functional input exists which adheres to the wavelet condition, modified, in this case, to accommodate the weighted average rather than a uniform measure, the inverse can be obtained directly from the backprojection.

Partial Backprojections

A specific example will be used to illustrate the use of partial backprojections. On the surface of a half-sphere with the same geodesics through point $x_0$, a large number of objects are desired to be formed by taking pairs of geodesics through point $x_0$. In neural terms, correlations are forming, specifically junctions and end stopping cells of a particular variety.

The correlations may be made more like end stopping cells by taking half arcs joined at the point $x_0$. Since the two cases are conceptually identical, the latter formulation will be taken. The correlation may be built from the structures generated by a grid of half-spheres. The constructs are parameterized as follows: At each point x, sets are parameterized to be $g(\theta,\phi,x)$ where $\theta$ is the angle of the first half-geodesic, and $\phi$ is the angle from the first to the second. The Radon transform from the set of points to the set of $g(\theta,\phi,x)$ may be denoted by $$\hat{f}(g) = \sum_{j=2}^{k/2} f(x_{\theta j}) + f(x_0) + \sum_{j=k/2+1}^{k} f(x_{\theta+\phi j})$$ (Equation 13)

which is nothing more than the sum up one arc to $x_0$ plus the sum up the other arc.

Movement between representations is possible, using the formulation given for the discrete Radon transform above, by noting that if two such structures are taken, with $\theta_2=\theta_1+\pi/2$, and summed, another Radon transform may be defined on pairs of geodesics. This duplicates the value $f(x_0)$.

This representation is correct is correct in the following way. A set of geodesics through points is assumed at the start. The values on these geodesics are given by the Radon transform in the usual sense. If sets of these structures, characterized by fixed angle $\theta$, are added, a different average value formula is obtained, but the backprojection is of the same general form. Consequently, the result of the transformation may be inverted in a single step.

Generalizing this model, sets of geodesics may be taken from the set of leaves in $Gx_0$, the set of all segments intersecting $x_0$. Because any set of these segments contains copies of $x_0$, and because by rotational symmetry, all rotations of such sets may be taken as a basis at each point, the same construct may be generated in forming an inverse. Such constructs are referred to as "partial backprojections."

Partial backprojections are important for two reasons. The first reason is that there are important examples of these sets that correspond to human visual system constructs. The set just mentioned, for example, corresponds well to the angular cells among the hypercomplex cells—they respond to angles.

Thus, it is shown that, with some adjustments for a thresholding process that occurs in forming such unions (e.g., throw out high frequency wavelets), the output of such cells is reversible, and can be reversed in one backprojection step. This is an interesting point since feedback afferent on the early stages of the human visual system comes from stages that are separated by more than one step.

Also, for the visual system, in a space in which the input functions do not have an average value equal to zero, the entire algorithmic formula comes into play. Supposing a localized Radon transform of a color space, when inverting the color space, the backprojection may be adjusted or the backprojection may be filtered to render no dispersion in the point spread function. Then net effect is that edge information has been extracted at the expense of level set information, and the level set information has been replaced with a new value. This is identical to a gray world assumption in the retinex or similar algorithms.

The second reason that this transformation is important is because, being a grouping of the elements of the Radon transform (i.e. lines) into sets in an incidence structure, it represents another geometry for the Radon transform, which may be defined as the sum of the line values in the sets. This is just the definition given to the partial backprojection. Consequently, the sets that define a partial backprojection have been used to form a new Radon transform.

Bolker has shown that if these sets are spreads, then the transform so generated will be constant on the range of the Radon transform of the points. Bolker uses his in local form to build a cohomology-like sequence of transforms.

There is nothing preventing the taking of arbitrary sets of geodesics except tractability, however, and the one chosen is particularly practical. Because the sets chosen give response to a correlation of multiple (e.g., two in this example) orientations, they are defined by a pair of lines, and therefore have the dimension of a plane.

Figure 5:
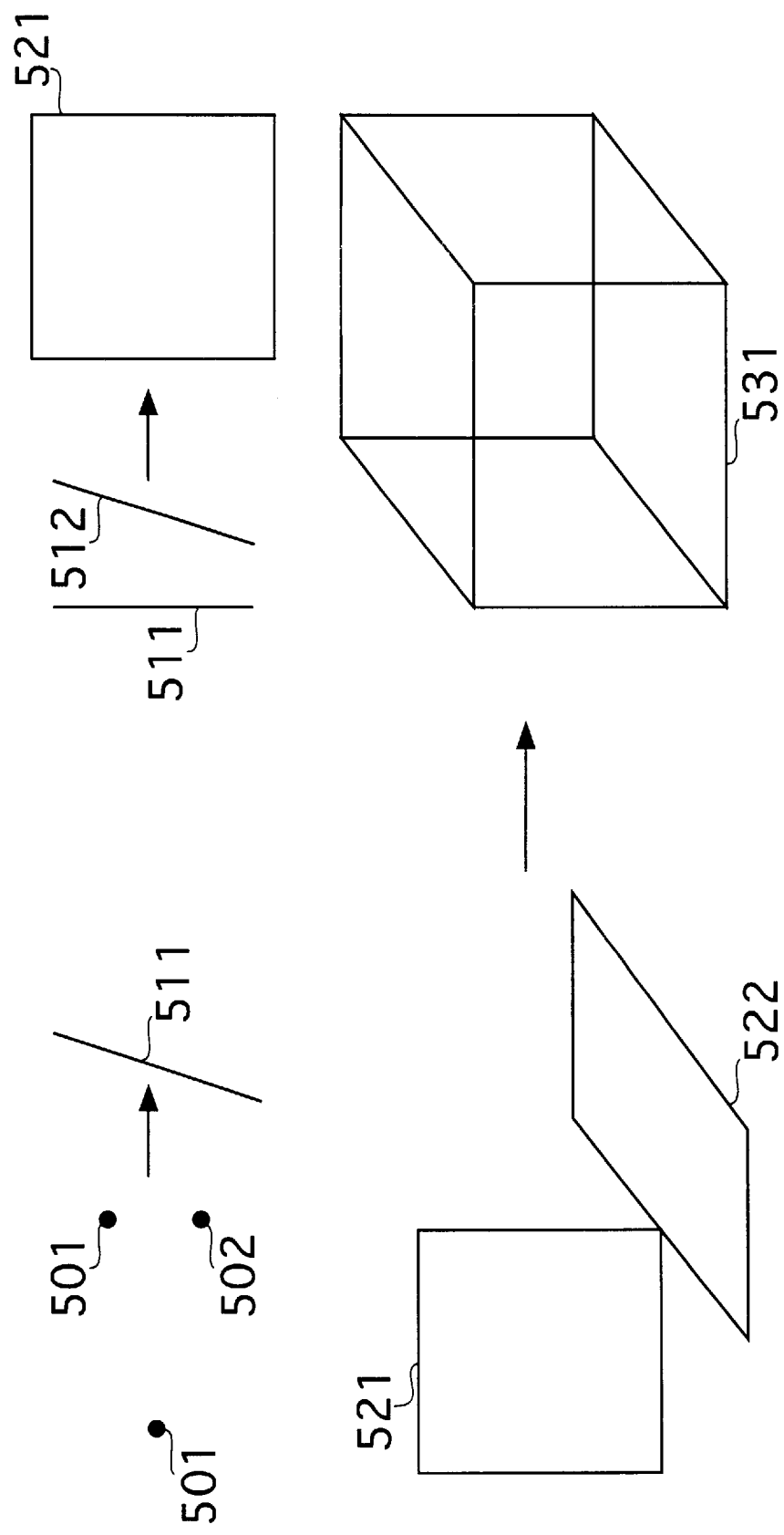
FIG. 5 is an illustration of one embodiment of building dimension.

FIG. 5 is an illustration of one embodiment of building dimension. Two points 501, 502 form a line 511. Two lines 511, 512 form a plane 521. Two planes 521,522 form a volume 531.

Evidently, this transformation has resulted in increasing the dimension by one. This is evident from the fact that two angles and a two dimensional position must be specified for each new segment set.

It may be noted that none of the derivation done for samples is affected by what dimension of sphere is being worked on, although one could add a factor of k for each dimension to satisfy intuition (the geodesics on $S^n$ are copies of $S^{n-1}$ sharing the property of common center with $S^n$). Consequently, Radon transform sequences may be built which build geometries of arbitrary dimension in this fashion.

Figure 6:
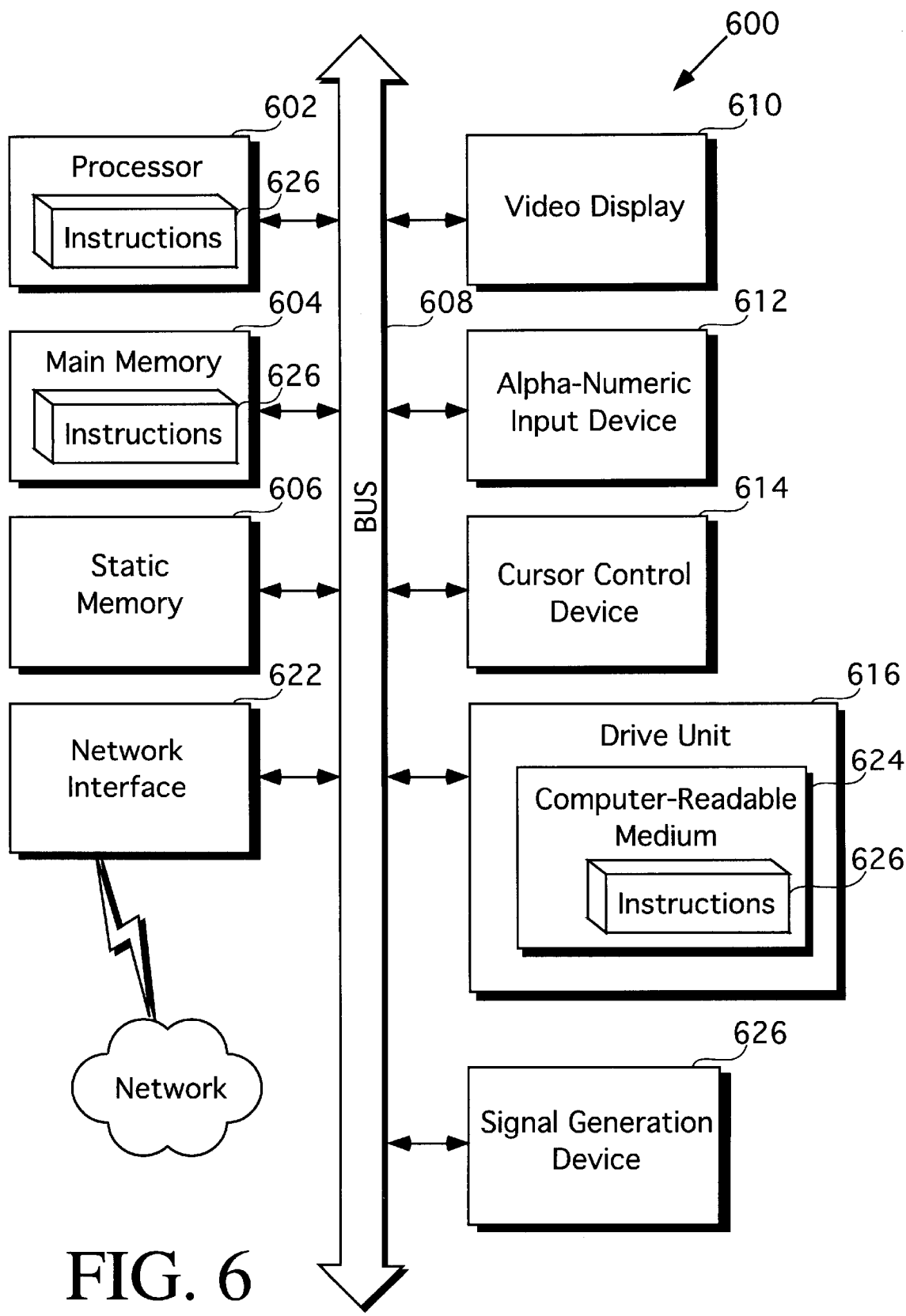
FIG. 6 is a block diagram of one embodiment of a computer system.

FIG. 6 shows a diagrammatic representation of machine in the exemplary form of a computer system 600 within which a set of instructions, for causing the machine to perform any one of the methodologies discussed above, may be executed. In alternative embodiments, the machine may comprise a network router, a network switch, a network bridge, Personal Digital Assistant (PDA), a cellular telephone, a web appliance or any machine capable of executing a sequence of instructions that specify actions to be taken by that machine.

The computer system 600 includes a processor 602, a main memory 604 and a static memory 606, which communicate with each other via a bus 608. The computer system 600 may further include a video display unit 610 (e.g., a liquid crystal display (LCD) or a cathode ray tube (CRT)). The computer system 600 also includes an alphanumeric input device 612 (e.g., a keyboard), a cursor control device 614 (e.g., a mouse), a disk drive unit 616, a signal generation device 620 (e.g., a speaker) and a network interface device 622.

The disk drive unit 616 includes a computer-readable medium 624 on which is stored a set of instructions (i.e., software) 626 embodying any one, or all, of the methodologies described above. The software 626 is also shown to reside, completely or at least partially, within the main memory 604 and/or within the processor 602. The software 626 may further be transmitted or received via the network interface device 622. For the purposes of this specification, the term "computer-readable medium" shall be taken to include any medium that is capable of storing or encoding a sequence of instructions for execution by the computer and that cause the computer to perform any one of the methodologies of the present invention. The term "computer-readable medium" shall accordingly be taken to included, but not be limited to, solid-state memories, optical and magnetic disks, and carrier wave signals.

Figure 7:
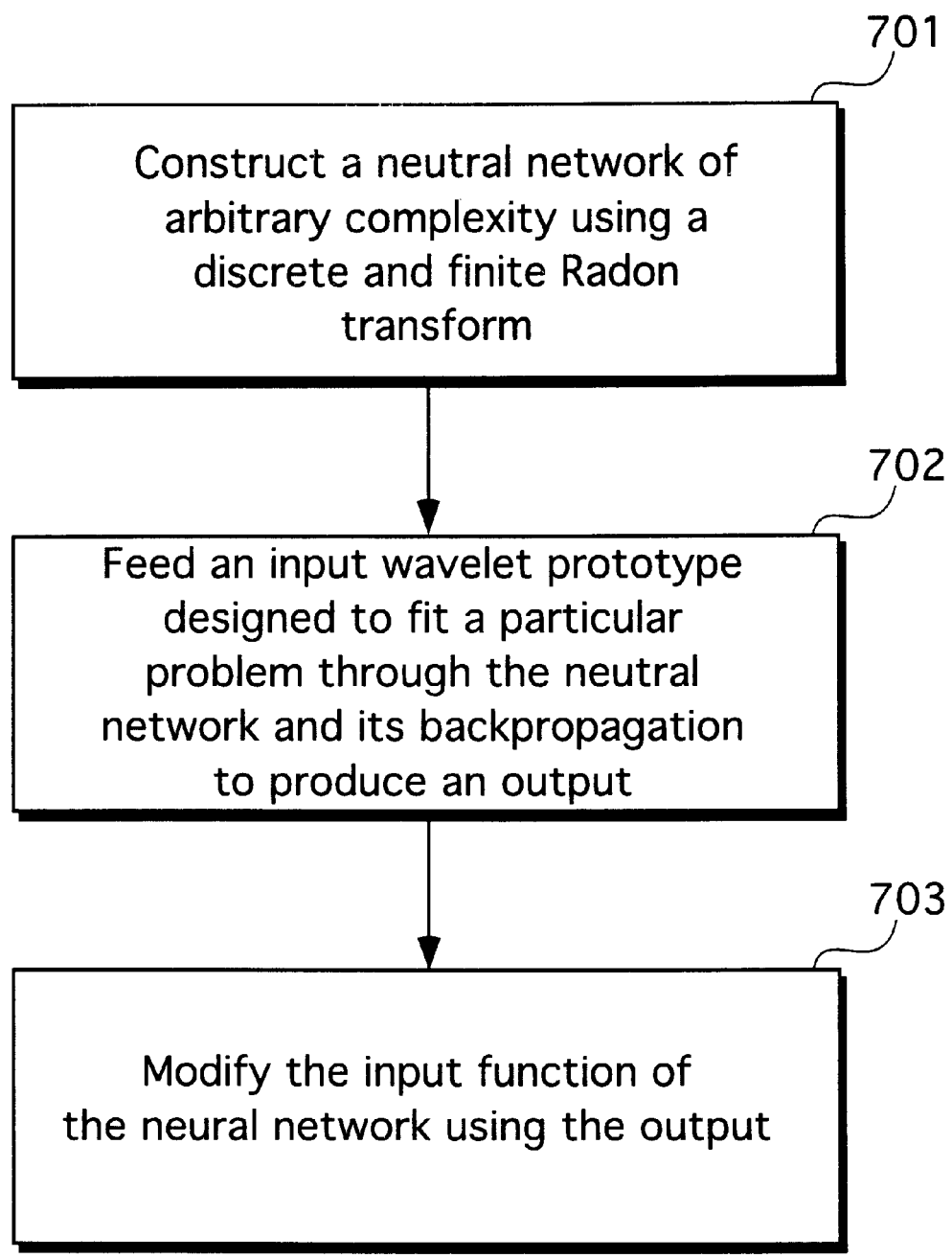
FIG. 7 is a flow diagram of one embodiment of a method of designing a set of wavelet basis.

FIG. 7 is a flow diagram of one embodiment of a method of designing a set of wavelet basis to fit a particular problem.

At processing block 701 a neural network of arbitrary complexity is constructed using a discrete and finite Radon transform. Central equation for doing the Radon transform may include the Gindikin equation or the Bolker equation referenced above.

Construction of the neural network will include back projecting the Radon transform to a point and subtracting a global average function of the point. The global average function is dependent on the transform geometry and may be varied by varying the interconnect structure by the neural network, as described above.

The Radon transform may be weighted to a desired template function. The neural network may be built to have a particular geometry so that, given a particular point, the size and shape of the line segments chosen for the Radon transform and its back projection form the particular geometry. The geometry may be any geometry such as, for example, a sphere or hyperbolic, etc.

The Radon transform is duel to the network because the neural network performs the Radon transform and inverts the Radon transform.

At processing block 702, an input wavelet prototype designed to fit a particular problem is fed through the neural network and its back propagation to use an output. The wavelet prototype may be a function which is close to the desired shape, if that is known. The wavelet is used to train the neural network to be specific to a certain set of images.

At processing block 703, the input function of the neural network is modified using the output. The input function is modified by subtracting the difference between the output of the neural net, which is the inverse of the Radon transform, and the input of the neural network, which is the original data, such as for example, an image. The difference between the output and the input is used by the neural network to modify the input function by moving the input function in the opposite direction from the difference between the output and the input. This is then a "mother wavelet" from which a wavelet basis local to that point to be formed.

This process converges to zero difference between input and output, which satisfies the wavelet condition. Thus, the neural network will produce wavelets that are capable of processing the images with little loss. The training of the neural network may continue until the difference between the output and the input reaches a predetermined value, which may be an error value for the neural network. Once the predetermined value is reached, the training will cease so that the neural network is not overtrained.

This method of constructing wavelets is optimized for massively parallel image processing and distribution. It optimizes around the image or template being processed, and does not require that the exact characteristics of the template be known analytically. The method of constructing wavelets also works for any dimension, and can work on data that comes from experiment, when a template is not known, by using the template as a block design.

The method is adaptive in parallel, and could be used to generate wavelet basis tuned to very specific templates, such as, for example, to measure differences. The method also allows wavelets be built for image analysis functions specifically, and allows "picture-centric" wavelet bases. Picture-centric wavelet bases includes wavelet bases that are specific to a certain type of image. For example, the wavelet bases may be constructed for images of houses, which have a large number of parallel and horizontal lines. The wavelet basis may also be constructed to be an edge detector, as described above.

The method of constructing wavelets generalizes to many dimensions, and may be used to compress multi-dimensional data. The method, with another dimension, may be appropriate to spatiotemporal data such as, for example, video. The method of constructing wavelets models the human visual system, and could be important to computer vision tasks.

Figure 8:
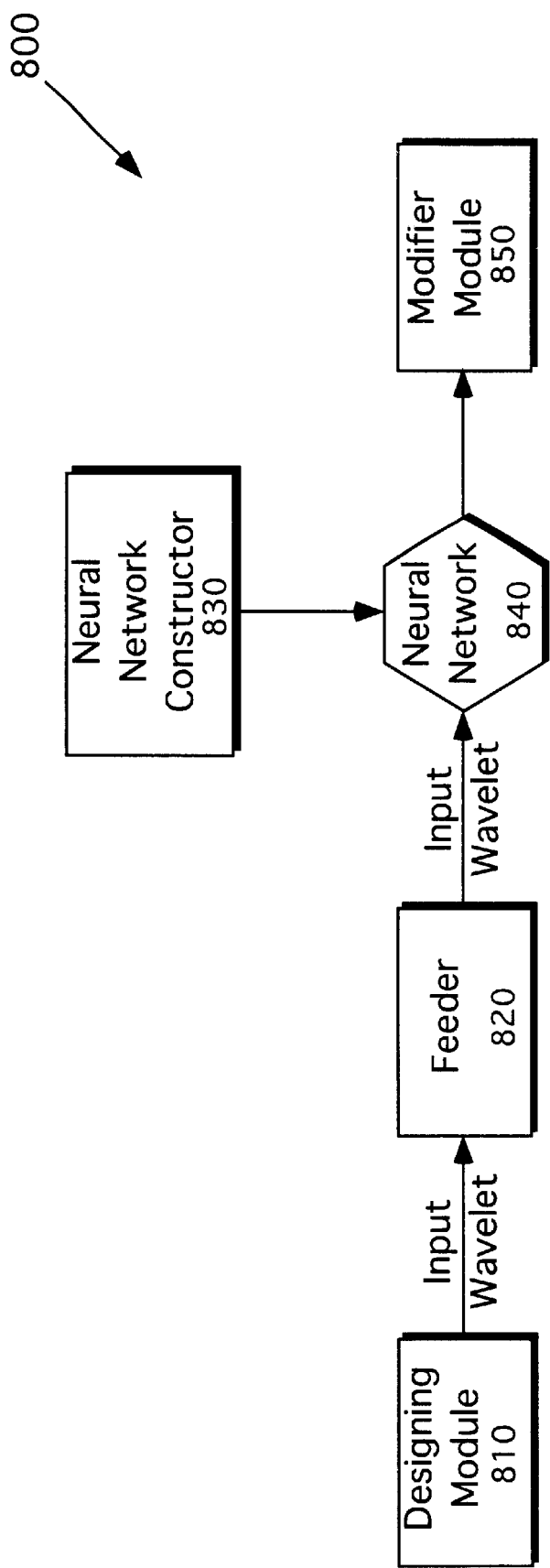
FIG. 8 is a block diagram of one embodiment of system for designing a set of wavelet basis.

FIG. 8 is a block diagram of one embodiment of system 800 for designing a set of wavelet basis. System 800 includes a designing module 810 coupled to a feeder 820. The designing module 810 designs an input wavelet to fit a particular problem and this input wavelet prototype is fed through a neural network 840 and its backpropagation to produce an output. The wavelet prototype may be a function which is close to the desired shape, if that is known. The wavelet is used to train the neural network 840 to be specific to a certain set of images.

The neural network 840 is of arbitrary complexity and is constructed by a neural network constructor 830 using a discrete and finite Radon transform. Central equation for doing the Radon transform may include the Gindikin equation or the Bolker equation as referred to above.

Construction of the neural network 840 will include back projecting the Radon transform to a point and subtracting a global average function of the point. The global average function is dependent on the transform geometry and may be varied by varying the interconnect structure by the neural network 840, as described above.

The Radon transform may be weighted to a desired template function. The neural network 840 may be built to have a particular geometry so that, given a particular point, the size and shape of the line segments chosen for the Radon transform and its back projection form the particular geometry. The geometry may be any geometry such as, for example, a sphere or hyperbolic, etc.

The Radon transform is duel to the network 840 because the neural network 840 performs the Radon transform and inverts the Radon transform.

The neural network 840 is also coupled to a modifier module 850 that modifies an input function of the neural network 840 using the output. The input function is modified by subtracting the difference between the output of the neural network 840, which is the inverse of the Radon transform, and the input of the neural network 840, which is the original data, such as for example, an image. The difference between the output and the input is used by the neural network 840 to modify the input function by moving the input function in the opposite direction from the difference between the output and the input. This is then a "mother wavelet" from which a wavelet basis local to that point to be formed.

This process converges to zero difference between input and output, which satisfies the wavelet condition. Thus, the neural network 840 will produce wavelets that are capable of processing the images with little loss. The training of the neural network 840 may continue until the difference between the output and the input reaches a predetermined value, which maybe an error value for the neural network 840. Once the predetermined value is reached, the training will cease so that the neural network 840 is not overtrained.

Figure 9:
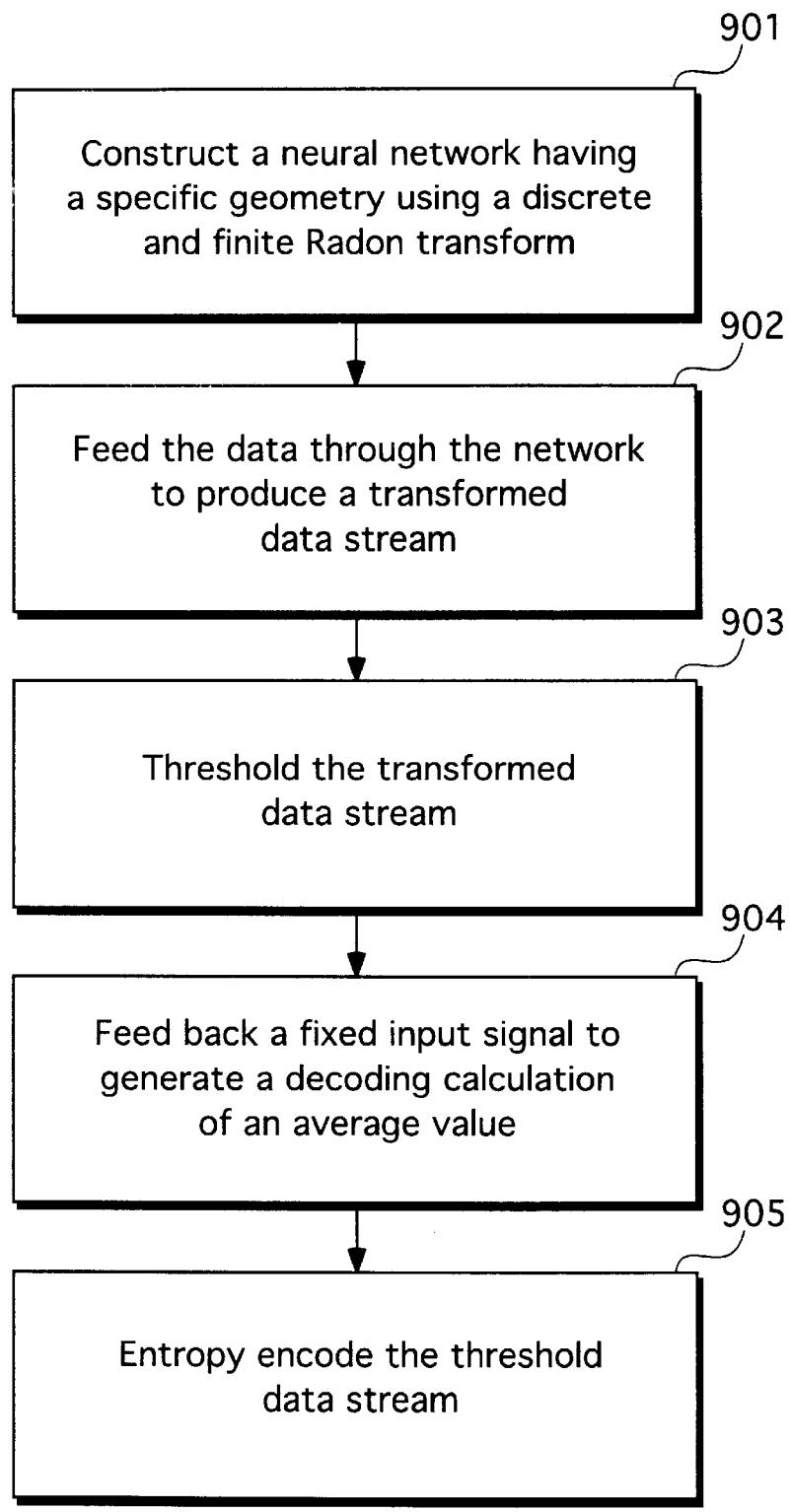
FIG. 9 is a flow diagram of one embodiment of a method of compressing images.

FIG. 9 is a flow diagram of one embodiment of a method of compressing images.

At processing block 901, a neural network having a specific geometry is constructed using a discrete and finite Radon transform. The construction of the neural network is based on an analysis of the geometry of the desired network. The specific geometry chosen may depend on the simplicity of the encoding, the simplicity of the decoding, the natural geometry suggested by the subject matter to be compressed, and/or the natural geometries suggested by the network architecture.

At processing block 902, the data to be compressed is fed through the network to produce a transform data stream. Data is passed through a neural network that produces the radon transform of the data. Passing it through the MLP stage produces the backprojection of the Radon transform. If the Radon transform is designated R, and the backprojection designated R*, then the whole system performs R*R on an input. Output is compared to input and weights are set for the input stage such that output minus input equals zero. The resulting input stage is a wavelet transform. Data passed through the input process is wavelet transformed by this stage. That constitutes the "transformed stream". By training the input stage to result in no blurring from the neural net, the input stage becomes a wavelet transform. Passing data through this stage results in a transformed (by the wavelet transform) stream.

At processing block 903, the transform data stream is thresholded. Thresholding the data stream may include thresholding the data based on predetermined criteria. The predetermined criteria may include quality of features to be preserved, such as, for example, outlines, or a criteria such as desired compression ratio. The thresholding process may also include removing components of the data stream above a predetermined maximum frequency. Thus, frequencies that, for example, would normally not be seen by the human eye, may be removed to reduce the amount of data to be compressed.

At processing block 904, a fixed input signal is fed back through the neural network to generate a decoding calculation of an average value. The average value will be used to invert the Radon transform to recover the transformed data.

Referring back to FIG. 1, the feedback connections eliminate the average, which causes blurring. This is a function of the geometry of the network. A signal may be input that is fixed and constant over the network inputs. This produces the blur part of the output. If the blur part of the output is fed back to the weights on the network, this can be used to tune the weights to make the output and input match to tune the network.

At processing block 905, the thresholded data stream is entropy encoded to compress the data stream. The thresholded data stream may be divided into a plurality of data streams if compressed data is to be stored in a distributed mode. In alternative embodiments, the compressed stream may also be zero-tree encoded or bitplane encoded. This produces the compressed stream. Whether the transformed stream should be thresholded and/or zero-tree or bitplane encoded depends on the geometric design of the Radon transform. The inverse is the inverse of the entropy and bitplane encoding plus the neural net expressing R*R. To decompress it, the entropy and bitplane or zero-tree encoding is inverted (standard) and passed through R*R which produces the original, decoded.

In the method of compression described, the wavelet used to transform data is designed by the shape of the oriented filters and the geometry of the neural network. Thus, the wavelets may be generated to fit extraordinary forms of compression demands, or specific material.

The method of compression also provides a method of cleaning the data while compressing it. In one embodiment, this is accomplished by using threshold functions which are soft (i.e., graduated rather than binary) for compression geometry that have multiple resolutions.

Since the geometry of the input, the geometry of the output, the configuration of the oriented filters, and the dimension of the compression are explicit, one embodiment of the method of compression allows extra control over compression optimization. By using partial backprojections, this embodiment allows storage of the compressed data in a form which could be used for texture detection, some curvature and three-dimensional information, without decompressing. The partial backprojections may be done by the use of correlation, such as the correlation of neighboring data, and allows image compression which is compatible with feature detection and query by content.

The method of compression allows a very general, but very analytical, method for designing image compression. The method allows image compression which minimizes concentration of activity on a network, training of specialized wavelet compression methods for special data, and the creation of compression methods consistent with image querying.

Figure 10:
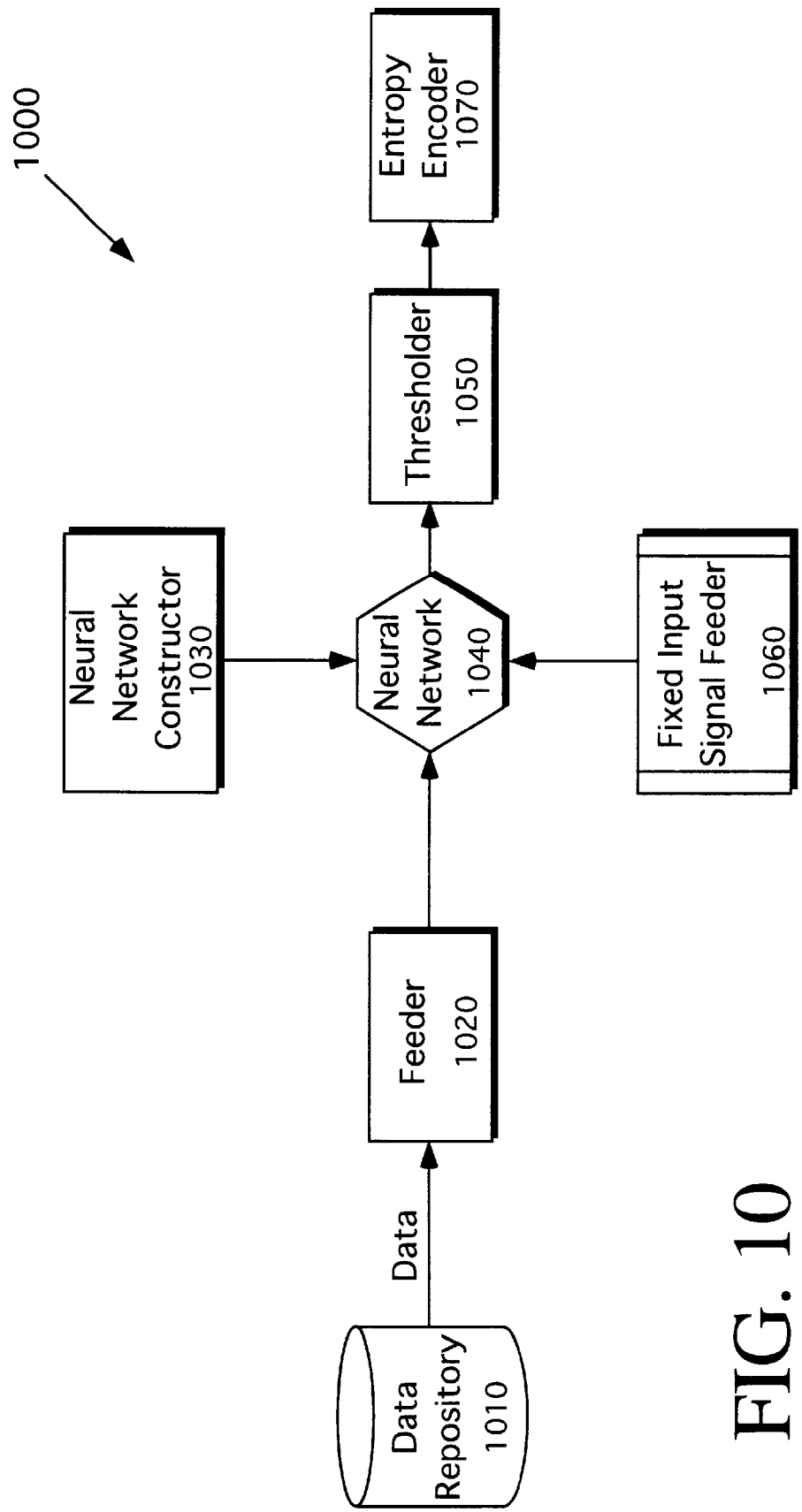
FIG. 10 is a block diagram of one embodiment of system for compressing images.

FIG. 10 is a block diagram of one embodiment of system 1000 for compressing images. System 1000 includes a data repository 1010 coupled to a feeder 1020. Data repository 1010 contains data to be fed through a neural network 1040 by the feeder 1020. The neural network 1040 has a specific geometry and is constructed by a neural network constructor 1030 by using a finite and discrete Radon transform.

The construction of the neural network 1040 is based on an analysis of the geometry of the desired network. The specific geometry chosen may depend on the simplicity of the encoding, the simplicity of the decoding, the natural geometry suggested by the subject matter to be compressed, and/or the natural geometries suggested by the network architecture.

The data is fed through the neural network 1040, and the neural network 1040 produces a transformed data stream.

The transformed data stream moves through a thresholder 1050 which thresholds the data stream. Thresholding the data stream may include thresholding the data based on predetermined criteria. The predetermined criteria may include quality of features to be preserved, such as, for example, outlines, or a criteria such as desired compression ratio. The thresholding process may also include removing components of the data stream above a predetermined maximum frequency. Thus, frequencies that, for example, would normally not be seen by the human eye, may be removed to reduce the amount of data to be compressed.

A fixed input signal feeder 1060 feeds a fixed input signal through the neural network 1040 to generate a decoding calculation of an average value. The average value will be used to invert the Radon transform to recover the transformed data. Referring back to FIG. 1, the feedback connections eliminate the average, which causes blurring. This is a function only of the geometry of the network. A signal may be input that is fixed and constant over the network inputs. This produces the blur part of the output. If the blur part of the output is fed back to the weights on the network, this can be used to tune the weights to make the output and input match to tune the network.

An entropy encoder 1070 is coupled to the thresholder 1050, and the entropy encoder 1070 encodes the thresholded data stream coming out of the thresholder 1050. This compresses the data stream. The thresholded data stream may be divided into a plurality of data streams if compressed data is to be stored in a distributed mode.

Figure 11:
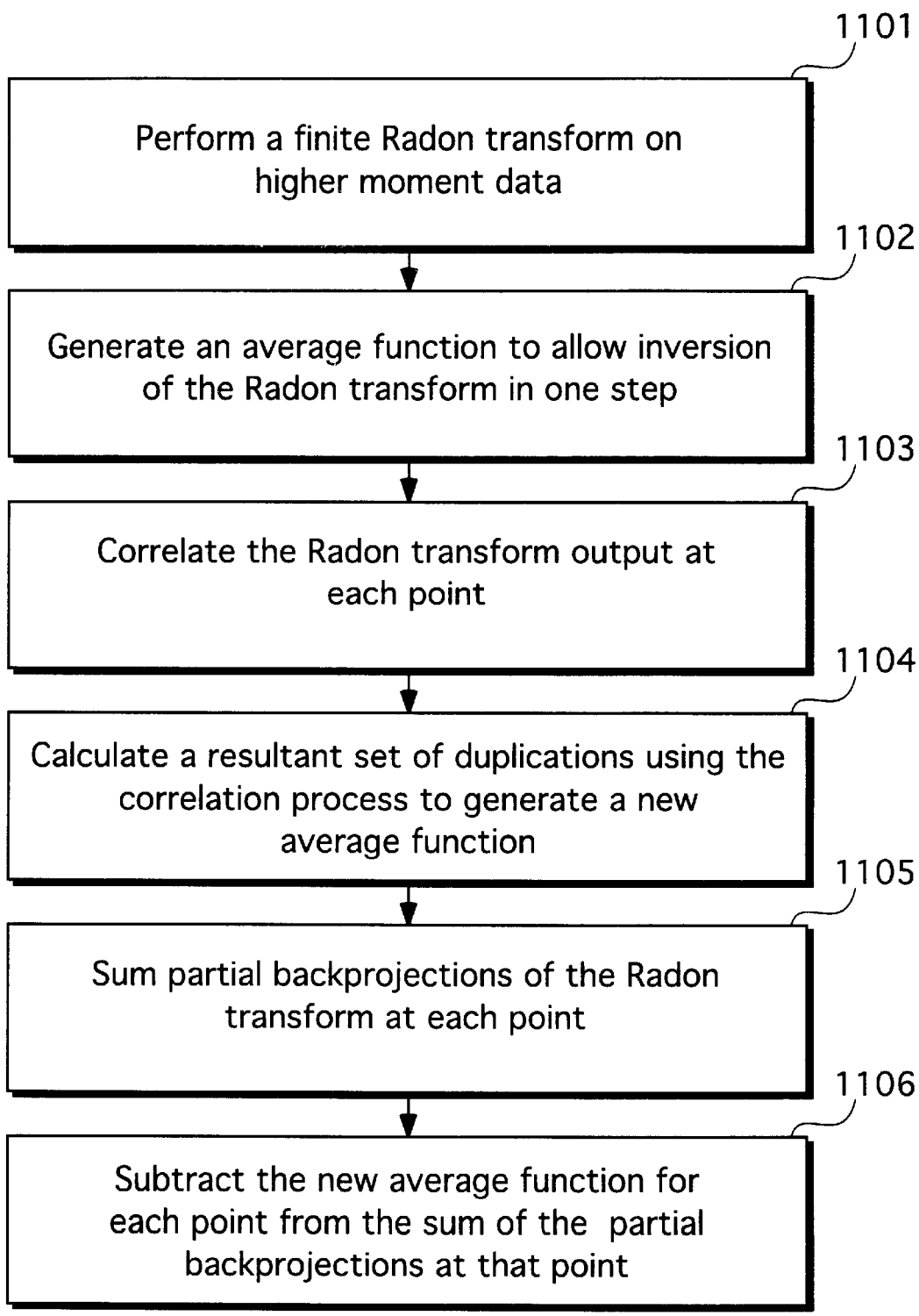
FIG. 11 is a flow diagram of one embodiment of a method of reconstructing audio/video/image data from higher moment data.

FIG. 11 is a flow diagram of one embodiment of a method of reconstructing audio/video/image data from higher moment data At processing block 1101, a finite Radon transform is performed on a higher moment data. At processing block 1102, an average function is generated to allow inversion of the Radon transform in one step. The average function may be calculated only based on the geometry and used for multiple reconstructions. At processing block 1103, the Radon transform at each point is correlated. When a Radon transform of a dimension one higher than the original transform is created by taking correlations at each point of the transformed data, a partial backprojection is produced.

At processing block 1104, a resultant set of duplications is calculated using the correlation process in order to generate a new average function. At block 1105, the sum is taken of the partial backprojections of the Radon transform at each point. The new average function for each point is subtracted from the sum of the partial backprojections at that point 1106. The inverse to each step is representative of the Gindikin formula.

In one embodiment, the general form for discrete Radon transforms is explicitly given, in new cases, specifically for the case in which balanced resolved block designs are not present. The solution is not a relaxation method. The solution is consistent with moments generated in image analysis. Also, the solution takes geometry into account, significantly generalizing the moment method of describing image data.

The method disclosed, when executed in parallel, is potentially faster, since it requires only a single step. Also, the average function may be calculated only based on the geometry and used for multiple reconstructions. The solution can also model many different experimental designs and correlation statistics. In addition, the method can be trained for geometries with no closed form by backprojecting a constant function.

Figure 12:
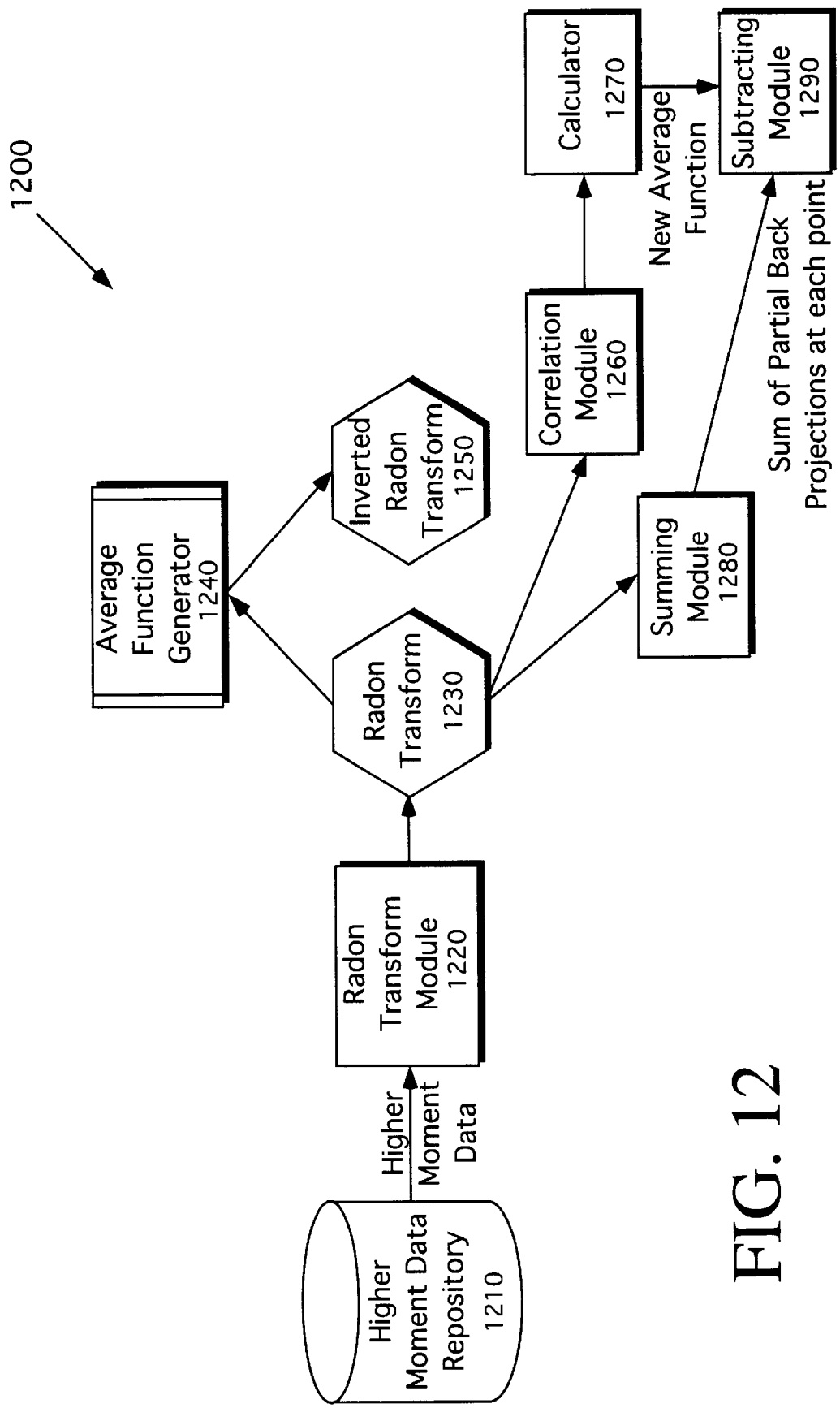
FIG. 12 is a block diagram of one embodiment of system for reconstructing audio/video/image data from higher moment data.

FIG. 12 is a block diagram of one embodiment of system 1200 for reconstructing audio/video/image data from higher moment data. System 1200 includes a higher moment data repository 1210 coupled to a Radon transform module 1220. The higher moment data repository contains higher moment data that is used by the Radon transform module 1220 to perform a finite Radon transform 1230.

An average function generator 1240 generates an average function to allow inversion of the Radon transform 1230 in one step 1250. The average function may be calculated only based on the geometry and used for multiple reconstructions.

A correlation module 1260 correlates the Radon transform 1230 at each point. When a Radon transform 1230 of a dimension one higher than the original transform is created by taking correlations at each point of the transformed data, a partial backprojection is produced.

A calculator 1270 coupled to the correlation module 1260 calculates a resultant set of duplications using the correlation process to generate a new average function.

A summing module 1280 sums partial backprojections of the Radon transform 1230 at each point. A subtracting module 1290 is coupled to both the calculator 1270 and the summing module 1280. The subtracting module 1290 subtracts the new average function for each point from the sum of the partial backprojections at that point. The inverse to each step is representative of the Gindikin formula.

In one embodiment, the general form for discrete Radon transforms is explicitly given, in new cases, specifically for the case in which balanced resolved block designs are not present. The solution is not a relaxation method. The solution is consistent with moments generated in image analysis. Also, the solution takes geometry into account, significantly generalizing the moment method of describing image data.

Figure 13:
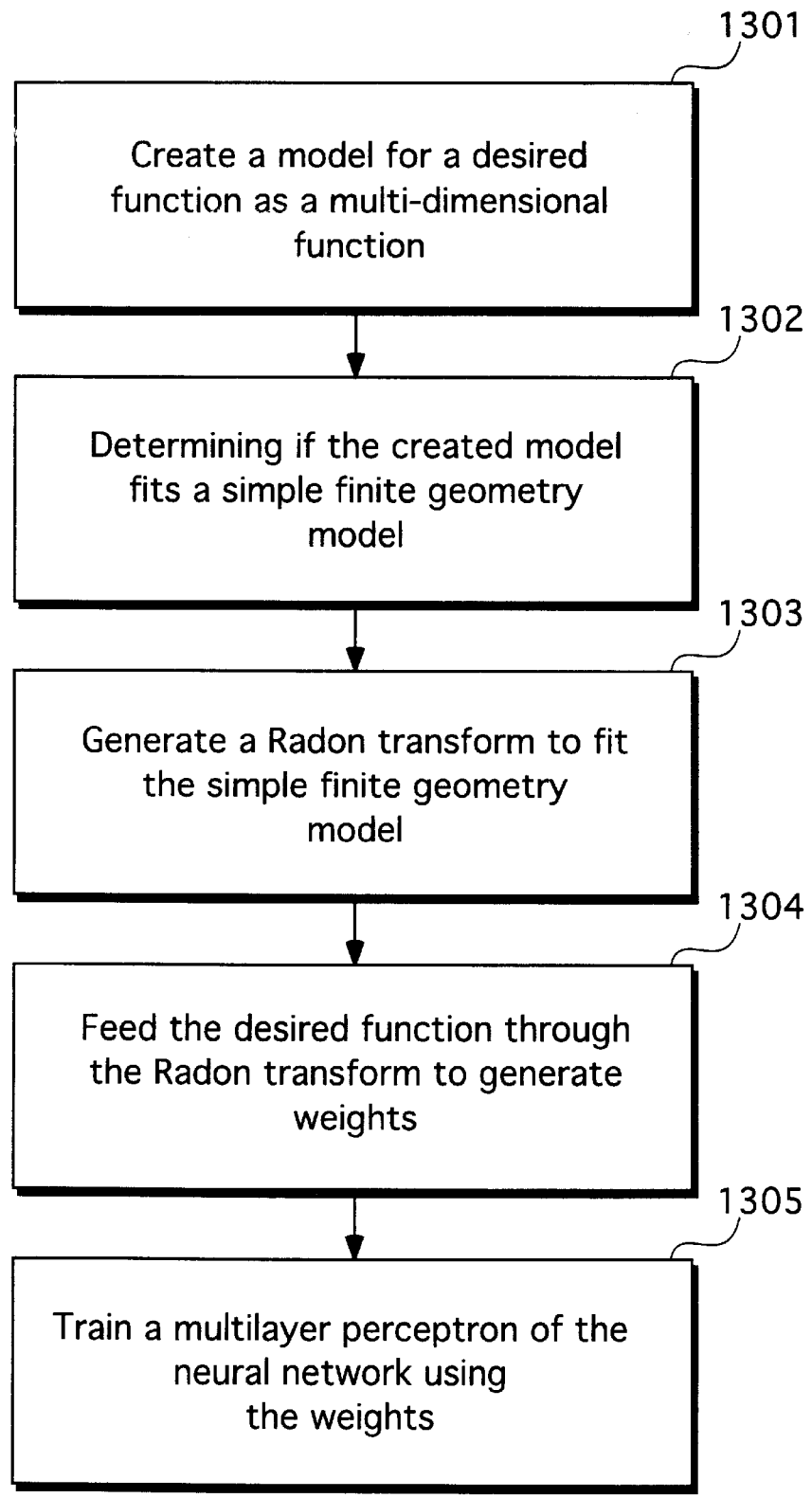
FIG. 13 is a flow diagram of one embodiment of a method of using a neural network to train a neural network.

FIG. 13 is a flow diagram of one embodiment of a method of using a neural network to train a neural network.

At processing block 1301, a model for a desired function is created as a multidimensional function. A decision is made as to whether to model it in a single stage or not. In one embodiment at processing block 1302, to determine whether to model the function as a single stage or not, it is determined if the created model fits a simple finite geometry model or not. There is always a geometry that will fit a particular application. If that geometry is better expressed as being of higher dimension than 2, then the model will be to used multiple stages.

At processing block 1303, a Radon transform is generated to fit the simple finite geometry model. The desired function is fed through the Radon transform to generate weights at processing block 1304. These weights are then used to train a multilayer perceptron of the neural network as seen at processing block 1305.

In this method, the constructive proof is used to program neural networks for more than simple model problems. Now, neural networks can be created which can model arbitrary functions with simple inversion formulas, making their programming easier.

This method allows single pass training of a neural network once the geometry of the training network is specified. It also allows the interpolation of neurons in the hidden layer to add specificity. This is not currently done with backpropagation. In addition, it allows simplification of a neural network functionality by analytic techniques from geometry and combinatorics.

Furthermore, the present invention presents a new, possibly simpler way to program neural networks. This may allow more networks to be built with the same geometry in less time, by giving different input specifications to the training network. It also presents a way to add nodes to networks without rebuilding or retraining the network. Currently, if the size of a multilayer perceptron is misestimated, the process requires going through the entire training cycle again. With this method of training, only angular projections are added. These can be calculated to interpolate the existing neurons.

Figure 14:
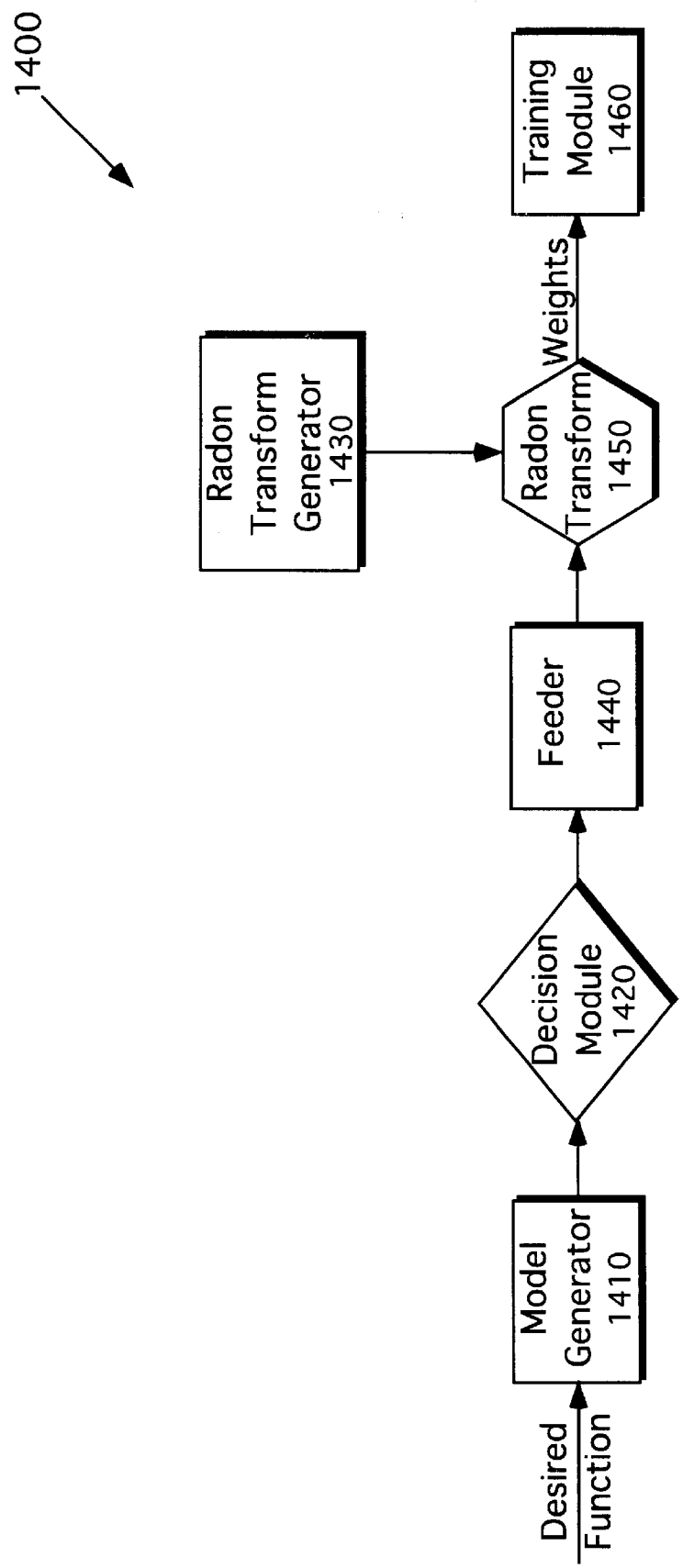
FIG. 14 is a block diagram of one embodiment of system for using a neural network to train a neural network.

FIG. 14 is a block diagram of one embodiment of system 1400 for using a neural network to train a neural network. System 1400 includes a model generator 1410 coupled to a decision module 1420. The model generator 1410 creates a model for a desired function as a multi-dimensional function. In order to determine whether to model the function as a single stage or not, the decision module 1420 determines if the created model fits a simple geometry model or not. There is always a geometry that will fit a particular application. If that geometry is better expressed as being of higher dimension than 2, then the model will be to use multiple stages.

A Radon transform generator 1430 generates a Radon transform 1450 to fit the simple geometry model, and a feeder 1440 feeds the desired function through the Radon transform 1450 to generate weights. A training module 1460 trains a multilayer perceptron of the neural network using the weights.

The specific arrangements and methods herein are merely illustrative of the principles of this invention. Numerous modifications in form and detail may be made by those skilled in the art without departing from the true spirit and scope of the invention.

What is claimed is:

1. A method of compressing data, the method comprising:
   constructing a neural network having a specific geometry using a finite and discrete Radon transform;
   feeding the data through the neural network to produce a transformed data stream;
   thresholding the transformed data stream;
   feeding back a fixed input signal to generate a decoding calculation of an average value; and
   entropy encoding the thresholded data stream.

2. The method of claim 1 further comprising dividing the thresholded data stream to produce more than one stream of thresholded data if the data is to be stored in a distributed mode.

3. The method of claim 1 wherein designing a neural network comprises designing a neural network based on predetermined criteria.

4. The method of claim 3 wherein the predetermined criteria is selected from the group consisting of simplicity of encoding, simplicity of decoding, natural geometries suggested by subject matter of the data, and natural geometries suggested by network architecture of the network in which the data will be stored.

5. The method of claim 1 further comprising:
   storing the entropy encoded data in distributed mode.

6. The method of claim 1 wherein thresholding the transformed data stream comprises thresholding based on predetermined criteria.

7. The method of claim 6 wherein the predetermined criteria is selected from the group consisting of quality of features to be preserved or a desired compression ratio.

8. The method of claim 1 wherein thresholding the transformed data stream includes removing components of the data stream above a predetermined maximum frequency.

9. A system for compressing data, the system comprising:
   means for constructing a neural network having a specific geometry using a finite and discrete Radon transform;
   means for feeding the data through the neural network to produce a transformed data stream;
   means for thresholding the transformed data stream;
   means for feeding back a fixed input signal to generate a decoding calculation of an average value; and
   means for entropy encoding the thresholded data stream.

10. A computer readable medium comprising instructions, which when executed on a processor, perform a method for compressing data, the method comprising:
    constructing a neural network having a specific geometry using a finite and discrete Radon transform;
    feeding the data through the neural network to produce a transformed data stream;
    thresholding the transformed data stream;
    feeding back a fixed input signal to generate a decoding calculation of an average value; and
    entropy encoding the thresholded data stream.

11. An apparatus for compressing data, the apparatus comprising:
    a neural network constructor that uses a finite and discrete Radon transform to construct a neural network having a specific geometry;
    a module to feed the data through the neural network to produce a transformed data stream, the module coupled to the neural network constructor;
    a thresholder to threshold the data stream, the thresholder coupled to the module;
    a fixed input signal feeder to feed back a fixed input signal to generate a decoding calculation of an average value, the fixed input signal feeder coupled to the thresholder; and
    an entropy encoder to entropy encode the thresholded data stream, the entropy encoder coupled to the fixed input signal feeder.

12. The apparatus of claim 11 further comprising a divider to divide the thresholded data stream such that the thresholded data stream produces more than one stream of thresholded data if the data is to be stored in a distributed mode.

13. The apparatus of claim 11 wherein the neural network constructor is configured to design a neural network based on predetermined criteria.

14. The apparatus of claim 13 wherein the predetermined criteria is selected from the group consisting of simplicity of encoding, simplicity of decoding, natural geometries suggested by subject matter of the data, and natural geometries suggested by network architecture of the network in which the data will be stored.

15. The apparatus of claim 11 further comprising a storage module to store the entropy encoded data in distributed mode.

16. The apparatus of claim 11 wherein the thresholder is configured to threshold the transformed data stream based on predetermined criteria.

17. The apparatus of claim 16 wherein the predetermined criteria is selected from the group consisting of quality of features to be preserved and a desired compression ratio.

18. The apparatus of claim 11 wherein the thresholder is configured to remove components of the data stream above a predetermined maximum frequency.

* * * * *